(12) United States Patent
Baumgartner et al.

(10) Patent No.: US 8,352,894 B2
(45) Date of Patent: Jan. 8, 2013

(54) VERIFICATION TECHNIQUES FOR LIVENESS CHECKING OF LOGIC DESIGNS

(75) Inventors: Jason R. Baumgartner, Austin, TX (US); Paul Joseph Roessler, Austin, TX (US); Ohad Shacham, Israel (IL); Jiazhao Xu, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/403,799

(22) Filed: Feb. 23, 2012

(65) Prior Publication Data

US 2012/0216159 A1 Aug. 23, 2012

Related U.S. Application Data

(62) Division of application No. 12/393,779, filed on Feb. 26, 2009.

(51) Int. Cl.
*G06F 17/50* (2006.01)
(52) U.S. Cl. ...................................... 716/106
(58) Field of Classification Search ............... 716/106
See application file for complete search history.

(56) References Cited

OTHER PUBLICATIONS

U.S. Appl. No. 12/393,779 entitled "Logic Design Verification Techniques for Liveness Checking"; Office Action (Restriction) dated Sep. 13, 2011.
U.S. Appl. No. 12/872,490 entitled "Techniques for Employing Retiming and Transient Simplification on Netlists That Include Memory Arrays"; Non-final office action dated Jun. 7, 2012.
U.S. Appl. No. 12/393,779 entitled "Logic Design Verification Techniques for Liveness Checking"; Non-Final Office Action dated Dec. 23, 2011.
U.S. Appl. No. 12/394,560 entitled "Logic Design Verification Techniques for Liveness Checking With Retiming"; Final Office Action dated Jan. 18, 2012.
U.S. Appl. No. 12/394,560 entitled "Logic Design Verification Techniques for Liveness Checking With Retiming"; Notice of Allowance dated Apr. 13, 2012.
U.S. Appl. No. 13/436,196 entitled "Logic Design Verification Techniques for Liveness Checking With Retiming"; Non-final office action dated Jul. 6, 2012.
U.S. Appl. No. 12/580,330 entitled "Techniques for Analysis of Logic Designs With Transient Logic"; Notice of Allowance dated Jul. 24, 2012.

*Primary Examiner* — Vuthe Siek
*Assistant Examiner* — Aric Lin
(74) *Attorney, Agent, or Firm* — Yudell Isidore Ng Russell PLLC

(57) ABSTRACT

A technique for verification of a logic design using a liveness-to-safety conversion includes assigning liveness gates for liveness properties of a netlist and assigning a single loop gate to provide a loop signal for the liveness gates. Assertion of the single loop gate is prevented when none of the liveness gates are asserted. A first state of the netlist is sampled and the sampled first state provides an initial state for a first behavioral loop for at least one of the liveness gates following the assertion of the single loop gate. The sampled first state of the first behavioral loop is compared with a later state of the first behavioral loop to determine if the sampled first state is repeated. A liveness violation is returned when the sampled first state is repeated and an associated one of the liveness gates remains asserted for a duration of the first behavioral loop.

20 Claims, 4 Drawing Sheets

VERIFICATION TECHNIQUES FOR LIVENESS CHECKING OF LOGIC DESIGNS

This application is a divisional of U.S. patent application Ser. No. 12/393,779, entitled "LOGIC DESIGN VERIFICATION TECHNIQUES FOR LIVENESS CHECKING," by Jason R. Baumgartner et al., filed Feb. 26, 2009, the disclosure of which is hereby incorporated herein by reference in its entirety for all purposes.

BACKGROUND

1. Field

This disclosure relates generally to integrated circuit logic design verification and, more specifically, to integrated circuit logic design verification techniques for liveness checking.

2. Related Art

In general, formal verification involves rigorously proving that an integrated circuit (IC) logic design (design) satisfies an associated specification. Typically, the specification of a verification problem includes a netlist representation of a design and a set of expected values for specified nets of the netlist. As an example, a verification problem may include determining whether a state exists in which a particular signal is asserted, where assertion of the particular signal indicates a fault. Using formal verification, an attempt is made to find a counter-example trace that includes a sequence of net values over time (states) that leads to an assertion of a particular signal or prove that no counter-example trace exists that leads to the assertion of the particular signal.

Formal verification is often performed using state space search algorithms, which include unbounded and bounded exhaustive search algorithms. Bounded exhaustive search algorithms attempt to find an assertion of a particular signal that occurs within 'N' time-steps from an initial state of a design. Unbounded exhaustive search algorithms increase 'N' until no states are encountered that have not already been encountered for smaller values of 'N' (a condition referred to as a 'fixed-point'). If no path from an initial state to a violating state (i.e., a state in which the particular signal is asserted) is encountered before the fixed-point is reached, then correctness of a design can be inferred.

The number of verification cycles required to perform an exhaustive state space search increases exponentially with the number of state elements (e.g., registers, latches, flip-flops, etc.). This exponential relationship makes formal verification impractical for designs containing a large number of state elements (e.g., one-hundred or more state elements). As a result, semi-formal verification has been employed as a verification technique for large designs. Semi-formal verification leverages formal algorithms by applying the formal algorithms to larger designs in a resource-bounded manner. While requiring less computation time (as compared to formal verification), semi-formal verification may only achieve partial verification coverage.

Verification constraints (constraints) are constructs that may be employed in design verification applications. A constraint may be implemented as a specially-labeled gate (i.e., a constraint gate) in a netlist of a design. In general, a constraint represents a limitation on the freedom of a verification tool to explore a state space of a design. For example, a constraint may prevent a verification application from exploring any 'j' time-step trace in which any of one or more constraints evaluate to a logical zero during any of the 'j' time steps. Typically, a constraint defines a portion of a state space of a design that is irrelevant for verification purposes and, as such, would unnecessarily consume verification resources if the constraint were verified. As one example of a constraint, 'a design may be constrained to prevent new transfers of data when a buffer is full'. In general, constraining inputs of the design to prohibit data transfers when the buffer is full means that a verification tool does not cover states that represent the design accepting new data transfers when the buffer is full.

In the absence of a constraint, a typical verification problem is stated as, for example, find a 'j' step trace that exhibits a violation of a property or prove that no such trace exists for any 'j'. With a constraint, the same verification problem may be expressed as, for example, find a 'j' step trace that exhibits a violation of a property and does not exhibit a logical zero value for any constraint in any of the 'j' steps, or prove that no such trace exists for any 'j'. Because constraints alter the semantics of a verification problem, constraints have the potential to cause a property that could be reached by a design to become unreachable. As such, it is desirable to select constraints judiciously. In general, constraints should not alter semantics of a verification problem. A constraint, for example, that would prevent a verification tool from discovering a valid assertion of a signal should not be permitted. Because constraints prohibit the exploration of certain otherwise reachable states, redundancy removal algorithms may leverage constraints to enable greater gate merging. In particular, redundancy removal algorithms may merge gates that are equivalent in all states reachable along paths that do not violate any constraints, even if the merged gates are not equivalent in some states that are reachable only after violating a constraint.

As previously mentioned, a verification tool operates on a model of a design known as a netlist. A netlist includes gates and edges, which represent interconnections between gates. A gate may, for example, fall into one of four broad functional categories: constant gates, random gates, combinational gates, and state elements (e.g., registers and sequential gates, such as latches and flip-flops). A constant gate produces a logic level that does not vary with time. A random gate (also referred to as a primary input) may assume any logic level in any time-step independent of all other gates. A combinational gate is a logical element such as an AND gate, an OR gate, a NAND gate, a NOR gate, etc. A sequential gate has an associated initial value function and a next state function. The value of a sequential gate at time '0' (t0) is the value of the initial value function. The value of a sequential gate at time 'i+1' is equal to the value of the next state function of the sequential gate at time 'i'.

A cutpoint gate may be introduced (into a modified netlist) by replacing a sequential gate in an original netlist with a random gate. An output of a random gate drives the same inputs in the modified netlist as an associated sequential gate drove in an original netlist. Unlike the inputs of the sequential gate in the original netlist, however, the inputs of the random gate are random inputs that are not connected to any other elements of the modified netlist. Inputs to a random gate can assume any value on any gate cycle irrespective of other stimulus applied to a design. As such, the net effect of introducing cutpoints into a netlist may be to over-approximate the behavior of a design, as a random gate can simulate behavior of the sequential gate, while the converse is not necessarily true. As an over-approximate model of an original netlist, a modified netlist may include states from which a target gate could not be asserted in the original netlist.

Retiming techniques, which were originally developed for enhanced synthesis, have more recently been proposed to enhance verification (i.e., reduce verification time) through reduction in latch (flip-flop) count. Generally speaking, retiming refers to the process of moving latches across combinational gates. In general, many prior art retiming algorithms have shifted every gate in a design under verification by an arbitrary amount, which may pose challenges to the use of retiming in a verification setting under the presence of constraints.

Liveness checking of a design refers to verification of properties (of the design), which are used to assess whether the design eventually behaves in a correct manner. For example, when verifying an arbiter, it may be desirable to check a property that, for example, states 'every request presented to the arbiter is eventually granted'. Any counter-example trace to the property must be of infinite length to show a request that never receives a grant (i.e., an infinite length sequence of bad behavior). A counter-example trace is often represented using a finite-length trace, where some suffix of the trace (denoted by assertion of a specially-added LOOP signal (with a corresponding loop gate) added by a verification tool), which starts with a state and ends with the same state, may be infinitely repeated. For example, assuming that a trace runs from time '0' (t0) to time '50' (t50) and the LOOP signal is asserted at time '20' (t20), an initial state of a design at time t20 must correspond to a final state of the design at time t50 for a valid counter-example for the suffix (which extends from times t20 to t50). Semantically, the finite-length trace represents an infinite length counter-example as suffix (loop) behavior may be repeated as many times as desired to provide a request without a grant scenario.

Liveness checking may be contrasted with safety checking, which may be represented by checking whether a given signal of a design is ever asserted to a logical one. In general, safety checking refers to design verification of a property that may be disproven in a finite amount of time. In contrast, liveness checking refers to design verification of a property that requires an infinite amount of time to disprove. Liveness checking for a design can be cast as safety checking for the design through a known transformation, which facilitates sampling a current state of the design and later checking for a repetition of the state which completes a behavioral loop. However, the known transformation effectively doubles state elements of the design during verification and, as such, adds substantial overhead to a verification process.

SUMMARY

According to one aspect of the present disclosure, a technique for verification of a logic design (embodied in a netlist) using a liveness-to-safety conversion includes assigning liveness gates for liveness properties of the netlist and assigning a single loop gate to provide a loop signal for the liveness gates. Assertion of the single loop gate is prevented when none of the liveness gates are asserted. A first state of the netlist is sampled and the sampled first state provides an initial state for a first behavioral loop for at least one of the liveness gates following the assertion of the single loop gate. The sampled first state of the first behavioral loop is compared with a later state of the first behavioral loop to determine if the sampled first state is repeated. A liveness violation is returned when the sampled first state is repeated and an associated one of the liveness gates remains asserted for a duration of the first behavioral loop. The technique may be implemented by instructions executed in a computer system.

According to another aspect of the present disclosure, a technique for performing liveness checking of a logic design embodied in a netlist includes attempting to prove that a liveness gate cannot remain asserted for a bound 'k' that corresponds to a number of time-steps in a first trace. When the liveness gate does not remain asserted for the bound 'k', an unbounded proof of correctness is returned. When the liveness gate remains asserted for the bound 'k', the technique attempts to prove that a first state of the first trace can be repeated during a second trace. When the first state is repeated during the second trace and the liveness gate remains asserted, a concatenated trace (including the first and second traces) is returned that corresponds to an unbounded failure. The technique may be implemented by instructions executed in a computer system.

BRIEF DESCRIPTION OF THE DRAWINGS

The present invention is illustrated by way of example and is not intended to be limited by the accompanying figures, in which like references indicate similar elements. Elements in the figures are illustrated for simplicity and clarity and have not necessarily been drawn to scale.

DETAILED DESCRIPTION

Figure 1:
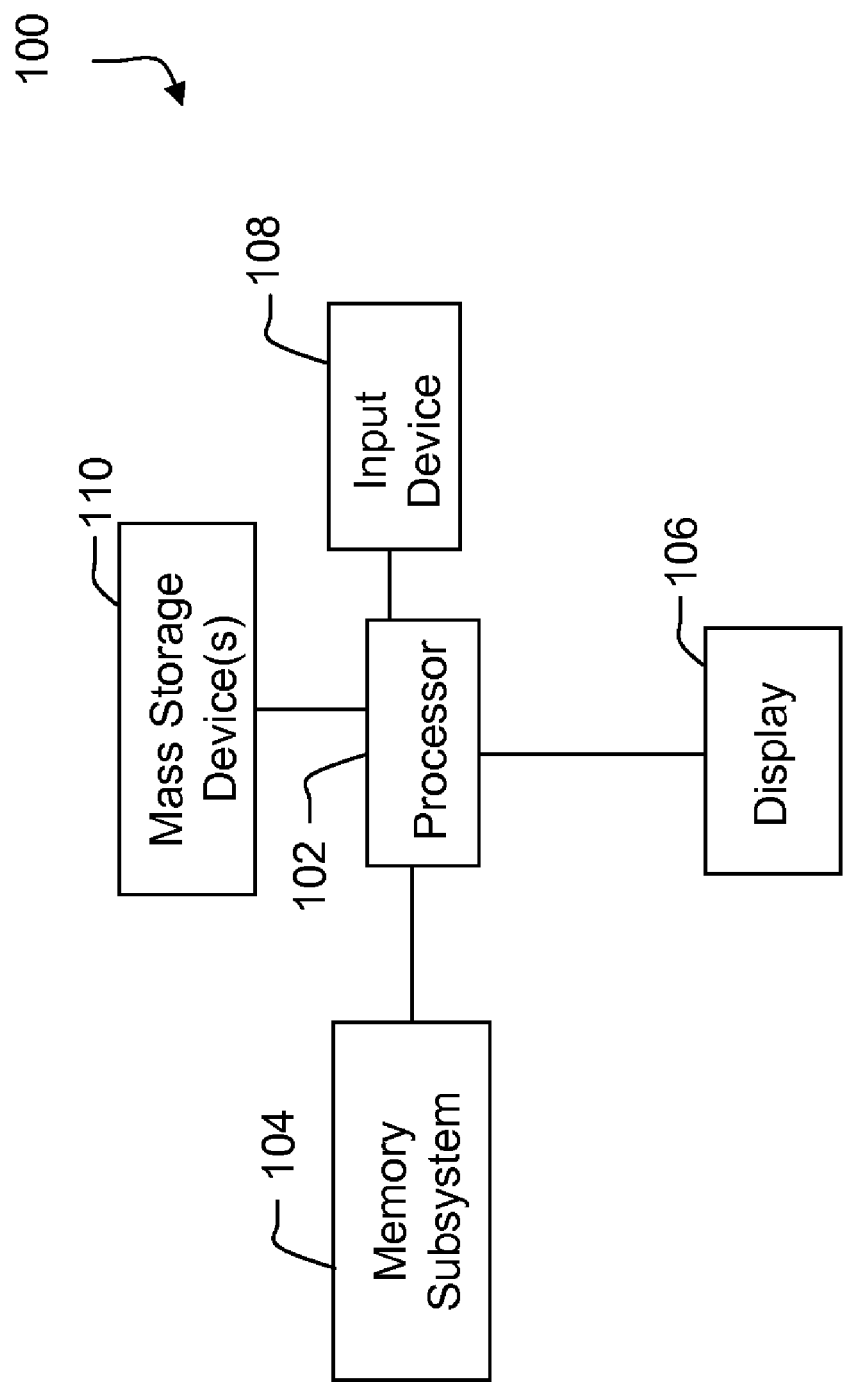
FIG. 1 is a diagram of an example computer system that may be employed to execute a verification tool configured according to the present disclosure.

As will be appreciated by one of ordinary skill in the art, the present invention may be embodied as a method, system, or computer program product. Accordingly, the present invention may take the form of an entirely hardware embodiment, an entirely software embodiment (including firmware, resident software, microcode, etc.), or an embodiment combining software and hardware aspects that may all generally be referred to herein as a "circuit," "module," or "system." Furthermore, the present invention may take the form of a computer program product on a computer-usable storage medium having computer-usable program code embodied in the medium.

Any suitable computer-usable or computer-readable storage medium may be utilized. The computer-usable or computer-readable storage medium may be, for example, but is not limited to, an electronic, magnetic, optical, electromagnetic, infrared, or semiconductor system, apparatus, or device. More specific examples (a non-exhaustive list) of the computer-readable storage medium includes: a portable computer diskette, a hard disk, a random access memory (RAM), a read-only memory (ROM), an erasable programmable read-only memory (EPROM) or Flash memory, a portable compact disc read-only memory (CD-ROM), an optical storage device, or a magnetic storage device. It should be noted that the computer-usable or computer-readable storage medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this disclosure, a computer-usable or computer-readable storage medium may be any medium that can contain or store the program for use by or in connection with an instruction execution system, apparatus, or device.

Computer program code for carrying out operations of the present invention may be written in an object oriented programming language, such as Java, Smalltalk, C++, etc. However, the computer program code for carrying out operations of the present invention may also be written in conventional procedural programming languages, such as the "C" programming language or similar programming languages.

The present invention is described below with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operations to be performed on the computer or other programmable apparatus to produce a computer implemented process such that the instructions which execute on the computer or other programmable apparatus implement the functions/acts specified in the flowchart and/or block diagram block or blocks. As may be used herein, the term "coupled" includes both a direct electrical connection between blocks or components and an indirect electrical connection between blocks or components achieved using one or more intervening blocks or components.

In general, known approaches for liveness checking have failed to address efficient modeling of liveness checks for semi-formal search paradigms, which may non-exhaustively explore a behavior of an IC logic design (design) under verification. Furthermore, known approaches for liveness checking have generally failed to provide an efficient automated mechanism to leverage multiple distinct algorithms and models of liveness for an overall more efficient and robust verification process.

According to one or more aspects of the present disclosure, efficient and robust techniques for verifying liveness properties (e.g., by converting them to safety properties) and applying a semi-formal verification paradigm (to achieve correctness proofs or obtain valid counter-examples) are disclosed herein. According to one or more embodiments, a technique to prevent exploration of useless behavioral loops, after which no liveness violations may occur, is disclosed. In general, the technique not only benefits non-exhaustive search algorithms (e.g., semi-formal search algorithms), but may also enhance proof of correctness (e.g., by reducing a degree of over-approximation). According to other aspects of the present disclosure, various techniques may be employed to simplify verification processes associated with the liveness-to-safety conversion. According to various embodiments, techniques are implemented to leverage multiple models and verification paradigms to solve liveness checking problems efficiently and robustly.

With reference to FIG. 1, an example computer system 100 is illustrated that may be configured to execute a verification tool (configured to verify an integrated circuit logic design (design)) and a retiming engine (configured to retime latches of the design for the verification tool) that are configured according to various embodiments of the present disclosure. The computer system 100 includes a processor 102 that is coupled to a memory subsystem 104, a display 106, an input device 108, and mass storage device(s) 110. The memory subsystem 104 includes an application appropriate amount of volatile memory (e.g., dynamic random access memory (DRAM)) and non-volatile memory (e.g., read-only memory (ROM)). The display 106 may be, for example, a cathode ray tube (CRT) or a liquid crystal display (LCD). The input device 108 may include, for example, a mouse and a keyboard. The mass storage device(s) 110 (which may include, for example, a compact disc read-only memory (CD-ROM) drive and/or a hard disk drive (HDD)) are configured to receive or include discs that store appropriate code (e.g., an operating system (OS), a verification tool including a retiming engine, etc.).

According to various aspects of the present disclosure, a netlist is defined to include a finite directed graph with vertices (representing gates) and edges (representing interconnections between gates). The gates may include constant gates, random gates (primary inputs), combinational gates (e.g., AND gates, OR gates, NAND gates, and NOR gates), and state elements (e.g., registers and sequential gates such as latches and flip-flops). As noted above, a sequential gate has two associated components: a next-state function; and an initial-value function. The associated components of a sequential gate are represented as other gates in the graph. Semantically, for a given sequential gate, a value appearing at an initial-value function gate at time '0' (where the time t0 is an initialization or reset time) is applied as the value of the sequential gate at time t0 and a value appearing at a next-state function gate at time 'i' is applied to the sequential gate at time 'i+1'. A set of values for all state elements in a netlist is referred to herein as a 'state'.

When employing a safety-to-liveness conversion, selected gates in a netlist may be labeled 'target' gates and 'liveness' gates. Target gates correlate to safety properties, where a goal of the verification process is to find a way to drive a logical one to a target gate, or to prove that no such assertion of the target gate is possible. A liveness gate correlates to a different type of property that requires verification. In particular, the goal is to demonstrate that a liveness gate may be held at a logical one forever (and to generate a counter-example trace that illustrates the liveness property, if a valid counter-example trace is found), or to prove that the liveness gate cannot stay at a logical one forever. In a liveness counter-example, a liveness gate may be employed that initializes to logical zero and at some point in a counter-example trace becomes and stays at a logical one, assuming the counter-example trace is valid.

For example, for a counter-example of a request (for a bus) never receiving a grant, a liveness gate initializes to a logical zero, transitions to a logical one when a request is detected, and transitions to a logical zero when a grant is detected. For a valid counter-example, the liveness gate must transition to a logical one and remain at a logical one for the length of a trace suffix. Semantically, the suffix of the trace where the LOOP signal asserts to and remains at a logical one represents a state repetition sequence that may be infinitely repeated. In general, a liveness gate must evaluate to a logical one throughout a trace suffix in order for the suffix to constitute a valid counter-example.

Constraint gates, which represent 'constraints', may be implemented to artificially limit the stimulus that can be applied to a random gate of a design. For example, when searching for a way to drive a target gate to a logical one, a verification process may adhere to the rule that every constraint gate must evaluate to a logical one for every time-step up to and including the time-step at which the target gate is asserted. As one example, a constraint may be added to drive a logical one exactly when a vector of a random gate evaluates to even parity. Without this constraint, a verification tool would explore valuations with even or odd parity to the random gate. In the above case, only even parity would be explored.

A known technique for casting liveness properties to safety targets is to duplicate the state elements of a netlist. Under the control of a new random gate, representing assertion of a LOOP signal, the duplicated state elements sample and hold a current state of a design. The termination of a behavioral loop can then be detected by comparing the sampled state in the duplicated state elements with a current state of the netlist. Provided that an associated liveness gate remains asserted to a logical one during the duration of the LOOP signal (which can be detected by an accumulator that remembers any deassertion of the liveness gate since assertion of the LOOP signal), a valid counter-example to the liveness property is indicated. It should be appreciated that the resulting process may be implemented solely as a safety target.

Numerous algorithms may be employed when attempting to verify safety targets of a netlist. Formal verification algorithms attempt to exhaustively verify a design, against all behaviors, to expose design flaws and yield proofs of correctness. There are numerous types of formal algorithms, from techniques which exhaustively enumerate an exact set of reachable states of the netlist to over-approximating techniques such as 'induction'. Exact techniques (e.g., reachability analysis) are advantageous as they typically always generate conclusive results (i.e., pass or fail). However, exact techniques are computationally expensive and, as such, are typically only applicable to relatively small netlists. In general, over-approximating techniques are more readily scaled than exact techniques. Unfortunately, over-approximating techniques may be inconclusive and generate spurious failures due to the nature of the over-approximation, which may not be valid with respect to an original design.

Semi-formal verification algorithms are scalable techniques which may be useful in exposing design flaws. However, semi-formal verification algorithms are generally incapable of yielding proofs of correctness, as semi-formal verification algorithms generally do not fully explore a behavior of a design. For example, a semi-formal verification technique may employ random simulation to sample various reachable states of a design and then perform resource-bounded exhaustive search to explore all states reachable within 'N' time-steps from the various reachable states.

As noted above, according to at least one aspect of the present disclosure, a technique is implemented to prevent the exploration of useless behavioral loops, after which no liveness violations may occur. In general, the technique benefits incomplete search techniques (e.g., semi-formal analysis) and may also enhance proof of correctness by, for example, reducing a degree of over-approximation. In the previously-mentioned liveness-to-safety conversion, it is possible for a sampled behavioral loop to become irrelevant due to a variety of reasons. As a first example, a liveness gate may deassert after a LOOP signal is asserted (and a state of an associated netlist is sampled). In this case, an associated trace suffix does not constitute a valid counter-example for the liveness gate that deasserted. As a second example, when a state of a behavioral loop is sampled too early, the sampled state is not repeatable even if a later state of the behavioral loop is repeatable and would constitute a valid counter-example.

When exhaustive formal analysis of a design is performed, the above two occurrences are not particularly important as the occurrences are merely irrelevant behaviors that are eventually explored and ignored and, as such, any relevant counter-examples are still found. However, when employing semi-formal searches, the two occurrences may render the semi-formal searches ineffective. A straight-forward solution to the above problem is generally complicated.

One may attempt to prevent problems associated with the first example by preventing the LOOP signal from asserting until a liveness gate first asserts. However, for efficiency, it is usually desirable to only create one loop gate to track the LOOP signal for all liveness gates of a netlist with multiple liveness properties. In this case, the LOOP signal may assert before a given one of the liveness gates asserts. One may attempt to prevent problems associated with the second example by checking for the repetition of any state since the assertion of the LOOP signal, as contrasted with merely checking for a repetition of a state when the LOOP signal first asserts. However, such an approach does not usually work for symbolic analysis (e.g., Boolean satisfiability (SAT) or binary decision diagram (BDD) based analysis) or when the solution is implemented in a hardware device, since it is usually not possible to enumerate an arbitrarily large set of states using a finite-sized netlist.

According to at least one aspect of the present disclosure, the assertion of a LOOP signal may be prevented from occurring when no liveness gate is at a logical one. In general, not beginning a behavioral loop when no liveness gate is at a logical one prevents a semi-formal search from wasting resources. According to another aspect of the present disclosure, a constraint may be added that not all accumulators that track deassertion of respective liveness gates can flag such invalid conditions. In general, this forces a semi-formal search to backtrack as soon as the search becomes useless with respect to all liveness properties (as the constraint is not met when all the accumulators for the liveness gates are deasserted) and, thus, precludes the inefficiency exhibited in the first example. The above-mentioned constraint may also advantageously enhance the ability of over-approximate formal analysis techniques to render a proof of correctness, as constraints preclude the 'reachability' of certain behaviors of the design. In this case, states which are succeeded by deassertion of the liveness gates become constrained which reduces the over-approximation inherent in such techniques.

To fully address inefficiencies associated with the second example, a 'reset' mechanism may be built into the LOOP signal assertion to allow periodic resampling of the state. For efficiency, it is usually desirable that the underlying semi-formal search procedure not resample too frequently. For example, employing a fifty percent bias would result in resampling every second time-step. Resampling of a state may be implemented by, for example, implementing a configurable bias for the random signal to trigger resampling of the state. A more intricate solution may be employed to allow a semi-formal search to adaptively tailor itself For example, a resampling trigger may be based upon specific criteria, e.g., a range of time-steps relative to an initial state or relative to a user-specified or automatically derived scenario having been encountered in a design (e.g., a user of a verification tool, or an automated process, may specify one or more coverage goals which reflects a scenario of interest for the design (e.g., a buffer of a design becoming full or an arbiter receiving ten simultaneous requests)) and behavioral loop sampling may occur concurrently with or within a specified time-range after one of the scenarios is encountered.

Various techniques may be employed to simplify the verification problem associated with liveness-to-safety conversion. For example, verification performance may be improved if redundancy is eliminated from a netlist. That is, if two state elements can be determined to behave identically in all reachable states, verification performance may be enhanced by merging one of the state elements into the other state element. Similarly, if two state elements can be demonstrated to be antivalent (opposite) in all reachable states, verification performance may be enhanced if one of the state elements is merged into the inverse of the other state element. Causing duplicate state elements to initialize equivalently to counter-part state elements that they shadow and causing the duplicate state elements to update to concurrently identical values as the counter-part state elements that they shadow (until the LOOP signal asserts) preserves dependency relations between original state elements of the netlist and the duplicated state elements.

According to another aspect of the present disclosure, sampling of a behavior loop state (as dictated by a LOOP signal assertion) may be configured to specific points in time to better utilize semi-formal search. To reduce resource requirements (e.g., when a SAT-based analysis is used to detect state repetition), checking for repetition of a sampled behavior loop state may be forced to occur within a specific time-range after sampling of the state, upon a user generated coverage event, or an automatically generated coverage event.

Figure 2:
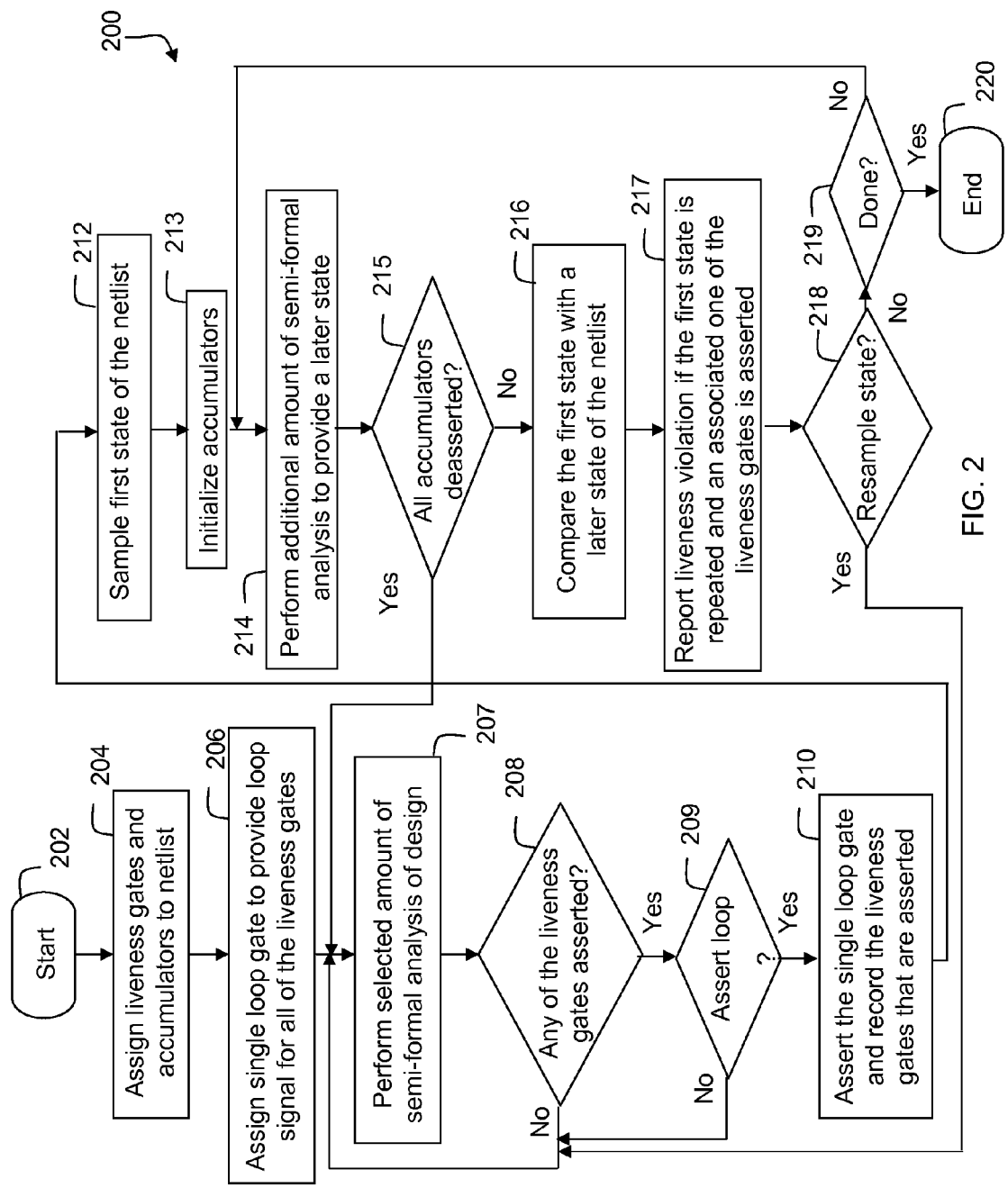
FIG. 2 is a flowchart of an example process for verification of an integrated circuit logic design (design), according to one embodiment of the present disclosure.

With reference to FIG. 2, a process 200 for verification of a logic design (embodied in a netlist) using a liveness-to-safety conversion is depicted. In block 202 the process 200 is initiated, at which point control transfers to block 204. In block 204, liveness gates and accumulators are assigned for each liveness property of the netlist. As noted above, the accumulators remember any deassertion of an associated liveness gate since assertion of the LOOP signal. Then, in block 206, a single loop gate is assigned to provide a LOOP signal for all of the liveness gates. Next, in block 207, a selected amount of semi-formal analysis is performed for the design. Then, in decision block 208, the process 200 determines whether any of the liveness gates are asserted. If none of the liveness gates are asserted in block 208, control loops back to block 207 (where a selected amount of semi-formal analysis of the design is performed) to prevent assertion of the single loop gate (when none of the liveness gates are asserted).

In block 208, when at least one of the liveness gates is asserted, control transfers to decision block 209 where the process 200 determines whether a behavioral loop should be initiated (i.e., whether a first state should be sampled and the design checkpointed). When assertion of the LOOP signal is not indicated, control transfers from block 209 to block 207. When assertion of the LOOP signal is indicated, control transfers from block 209 to block 210, where the single loop gate is asserted and the liveness gates that are asserted are recorded. Then, in block 212, a first state of the netlist is sampled responsive to assertion of the single loop gate. The sampled first state provides an initial state for a first behavioral loop for at least one of the liveness gates (following the assertion of the single loop gate).

Next, in block 213, the accumulators for the liveness gates are initialized. Then, in block 214, an additional amount of semi-formal analysis is performed in an attempt to provide a later state that corresponds to the sampled first state. Next, in decision block 215, the process 200 determines whether all of the accumulators are deasserted. In this case, an associated constraint is not met when all the accumulators for the liveness gates are deasserted. That is, when all of the liveness gates are deasserted, the previously performed semi-formal analysis is no longer of value. If all of the accumulators are deasserted in block 215, control transfers to block 207. If all of the accumulators are not deasserted in block 215, control transfers to block 216 where the sampled first state of the first behavioral loop is compared with the later state (e.g., a terminal state of the first behavioral loop) of the netlist to determine if the sampled first state is repeated.

Then, in block 217, a liveness violation is returned if the sampled first state is repeated and an associated one of the accumulators (that tracks deassertion of the appropriate liveness gate) remains asserted for a duration of the first behavioral loop. Following block 217, control transfers to decision block 218, where the process 200 determines whether resampling of a design state is indicated. When a resampling of the design state is indicated in block 218 (e.g., when a trigger is received), control transfers to block 207. For example, the trigger may be based on a configurable bias to a random signal of a random gate of the netlist. Alternatively, a more intricate solution may be employed to allow a semi-formal search to adaptively tailor itself.

For example, a resampling trigger may be based upon specific criteria, e.g., a range of time-steps relative to an initial state or relative to a user-specified or automatically derived scenario having been encountered in a design (e.g., a user of a verification tool or an automated process may specify one or more coverage goals which reflect a scenario of interest for the design (e.g., a buffer of a design becoming full or an arbiter receiving ten simultaneous requests)) and behavioral loop sampling may occur concurrently with or within a specified time-range after one of the scenarios is encountered. When a resampling of the design state is not indicated in block 218, control transfers to decision block 219. In block 219 when a termination of the process 200 is not indicated (e.g., when a first state is not repeated and the liveness gate is still asserted), control transfers to block 214, where an additional amount of semi-formal analysis is performed in an attempt to provide a new later state that equals the sampled first state. In block 219 when a termination of the process 200 is indicated, control transfers to block 220 where the process 200 terminates and control returns to a calling routine.

According to another embodiment, a technique to leverage multiple models and verification paradigms to solve a liveness checking problem efficiently and robustly may be implemented. The technique is based on the fact that if a liveness property cannot be violated, then there exists a finite bound for which an associated liveness gate cannot remain asserted. When bound, a liveness property can be proven correct with less overhead than required by a liveness-to-safety conversion, which requires duplicating all state elements. In this case, it may be directly proven that a corresponding liveness gate cannot remain asserted for longer than the specified bound (i.e., by checking a bounded liveness condition), which requires only $\log_2$(bound) additional state elements instead of doubling the state element count of the original netlist.

The $\log_2$(bound) state elements are used to implement a 'counter' to record how many time-steps a particular liveness gate was asserted. In particular, the 'counter' increments by one each time-step and is reset to a logical zero whenever the liveness gate is deasserted. To assess whether the liveness gate remained asserted for a 'bound' number of time-steps, a check is performed to determine whether the counter reached a value for the 'bound'. However, a given bound is difficult to determine and if a trace is computed that exceeds the given bound, the resulting trace cannot necessarily be extended to an infinite length counter-example. In this case, it may be ambiguous as to whether the bound was too small or whether the liveness property truly will fail. However, if the bound is made adequately large, it becomes more likely that the corresponding unbounded liveness property truly will fail.

According to this aspect of the present disclosure, a technique is employed that iteratively probes for an adequate bound to enable a proof of correctness, without the explicit behavioral loop state check. In general, the technique leverages traces that show the bounds were exceeded to attempt to more efficiently look for unbounded failures. The technique may be run in parallel to and independently from proof of correctness or falsification analysis and may be performed directly upon unbounded behavioral loop checking. At the outset, an initial value for a bound 'k' is selected. While the bound is not solved, an arbitrary verification algorithm may be utilized to attempt to demonstrate that the liveness gate cannot stick at a logical one for 'k' time-steps. Assuming that the liveness gate does not stick at a logical one for 'k' time-steps, an unbounded proof of correctness is indicated.

When a trace is obtained showing that the liveness gate can stick at a logical one for 'k' time-steps, a specified amount of resources may be employed to see if a state (e.g., a terminal state) of the trace can be repeated while retaining the liveness gate assertion. When state repetition is detected, the resulting trace may be concatenated with the trace that indicates the liveness gate stuck at a logical one and the result may be returned as an unbounded failure. If state repetition cannot be detected, the bound may be increased to a new value (e.g., a user-specified value, or one derived automatically, such as by doubling the prior value) of 'k' and the verification algorithm may be utilized with the new value of 'k' in an attempt to demonstrate that the liveness gate cannot stick at a logical one for 'k' time-steps.

Figure 3:
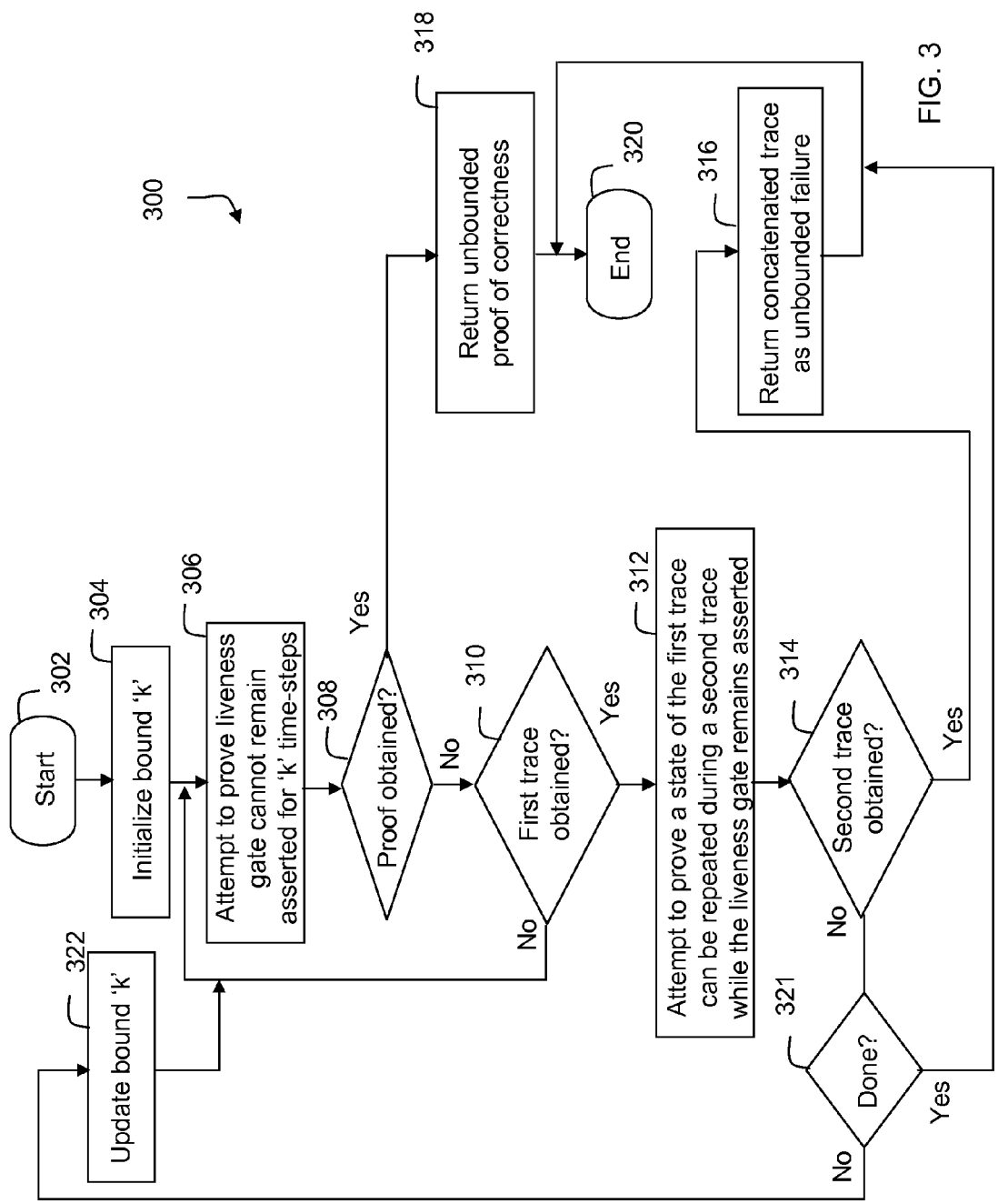
FIG. 3 is a flowchart of an example process for verification of a retimed design, according to another embodiment of the present disclosure.

With reference to FIG. 3, an example process 300 for performing liveness checking of a logic design (embodied in a netlist) is illustrated. The process 300 may be run in parallel with the process 200 of FIG. 2. In this case, when one of the processes 200 or 300 solves the problem, the remaining process 300 or 200 is terminated. The process 300 is initiated in block 302, at which point control transfers to block 304, where a bound 'k' is initialized to a selected value. Next, in block 306, the process 300 attempts to prove a liveness gate cannot remains asserted for 'k' time-steps. Then, in decision block 308, when a proof is obtained that the liveness gate cannot remain asserted for 'k' time-steps, an unbounded proof of correctness is indicated and control transfers from block 308 to block 318, where an unbounded proof of correctness is returned. Following block 318, control transfers to block 320, where the process 300 terminates and control returns to a calling routine. In block 308, when a proof is not obtained that the liveness gate cannot remain asserted for 'k' time-steps, a possible valid counter-example trace is indicated and control transfers to decision block 310.

In block 310, the process 300 determines whether a first trace is obtained (i.e., whether the liveness gate remained asserted for 'k' time-steps. If a first trace is not obtained, control transfers from block 310 to block 306. If a first trace is obtained, control transfers from block 310 to block 312. In block 312, the process 300 attempts to prove that a state (e.g., a terminal state) of the first trace is repeated during a second trace while the liveness gate remains asserted. Next, in block 314, the process 300 determines if the state of the first trace is repeated in the second trace while the liveness gate remains asserted (i.e., whether a second trace is obtained). If the state of the first trace is not repeated during the second trace, control transfers from block 314 to block 321. In block 321, the process determines whether the analysis is to terminate.

If termination of the process is not indicated in block 321, control transfers to block 322 where the bound 'k' is updated. From block 322, control transfers to block 306. If termination of the process is indicated in block 321, control transfers to block 320. If the state of the first trace is repeated during the second trace and the liveness gate remains asserted, control transfers from block 314 to block 316. In block 316 a concatenated trace (including the first and second traces) is returned as an unbounded failure. Following block 316, control transfers to block 320. The process 300 may be run in parallel to and independently from proof of correctness or falsification analysis and may be performed directly upon unbounded behavioral loop checking.

In general, the disclosed techniques may be employed to enhance virtually any verification paradigm. For example, the techniques disclosed herein are broadly applicable to formal verification techniques (e.g., BDDs and SATs) and semi-formal techniques which perform incomplete verification. The disclosed techniques may also be implemented in hardware acceleration frameworks. For example, as the process 200 of FIG. 2 may be implemented solely through altering a netlist representation of a problem, the problem can be readily implemented in a hardware acceleration framework or executed through a fabricated chip.

As noted above, retiming is a technique that is employed (during verification) to reduce the number of latches in a design by shifting the latches across combinational gates. The number of latches shifted backward across a given gate is referred to herein as the 'lag' of the given gate. The lag of a gate represents the number of time-steps that the gate, after retiming, delays the valuations of that gate before retiming. Retiming has been demonstrated to be a powerful technique to enhance verification, due to the ability of retiming to reduce latch count in a design. However, the use of retiming as a simplifying pre-processing technique for liveness checking is a highly intricate process. For example, employing retiming with liveness checking requires guaranteeing that any verification result obtained after retiming maps to a consistent result on a design prior to retiming.

According to another embodiment of the present disclosure, a technique is disclosed that uses retiming as a simplifying pre-process to the verification of liveness properties. In particular, the retiming formulation is constrained such that verification results obtained subsequent to retiming imply valid results for the design prior to retiming. In general, the disclosed technique facilitates consistent mapping of results across a retiming engine and, in this manner, makes the use of retiming transparent to a user.

Liveness checks often require the specification of 'fairness' constraints, which impose restrictions on behavior (during a behavioral loop) that may be presented as a failure. For example, assuming an arbiter under verification has a skewed priority scheme such that high-priority requests always take priority over low-priority requests, an infinite sequence of high-priority requests may starve out low-priority requests in a valid design. In this case, reporting of failures where high-priority requests within a behavioral loop starve out low-priority requests should be avoided. In this example, the deassertion of high-priority requests may be specified as a fairness constraint.

According to this aspect of the present disclosure, certain gates are labeled as liveness gates or fairness gates. As noted above, a liveness gate correlates to a liveness property that is to be verified. In particular, to prove a liveness property, the goal is to demonstrate that the liveness gate may be held at a logical one forever (and to generate a counter-example trace illustrating the scenario if a valid counter-example trace is found), or to prove that the liveness gate cannot stay at a logical one forever. As noted above, in a liveness counter-example, a special gate (i.e., a loop gate), which initializes to a logical zero and at some point in a trace becomes and stays at a logical one, is employed. Semantically, the suffix of the trace where the LOOP signal is at a logical one represents a state repetition sequence which may be infinitely repeated. As noted above, a liveness gate must evaluate to a logical one throughout the suffix to constitute a valid counter-example. In contrast, a fairness gate is a gate which must be asserted to a logical one for at least one time-step within any behavioral loop that is returned as a valid counter-example.

Retiming in the presence of liveness is a non-trivial problem, as retiming may shift gates of the design by different amounts and in this manner alter the semantics of the liveness and fairness problem. For example, assuming a liveness gate is forward retimed by five time-steps and a fairness gate is forward retimed by four time-steps, the retimed behavior of the liveness gate is effectively five time-steps earlier than the original design and the retimed behavior of the fairness gate is effectively four time-steps earlier than the original design. Assuming that a liveness counter-example trace is obtained based upon the post-retiming design (which shows the fairness condition occurring at the first time-step of the LOOP signal assertion), when the counter-example trace is mapped back to the original design (to undo the effects of retiming on the trace), the behavior of the liveness gate will be delayed five time-steps and the behavior of the fairness gate will be delayed four time-steps. In this case, the assertion of the fairness condition may actually occur one time-step earlier than the assertion of the liveness signal and the retimed trace may not correlate to a valid counter-example for the original design.

An additional complication is that a LOOP signal must be properly presented on a mapped counter-example trace, clearly illustrating a start and an end of a behavioral loop. Because every gate may generally be lagged by a different amount in retiming, the process of mapping retimed traces to the original design (which delays retimed values by their lag), may extend mapped traces beyond a repeatable state sequence. For example, a design that repeats states S1, S2, ..., S8 would have a valid liveness counter-example that includes eight time-steps. However, after retiming, a mapped counter-example may appear as S1, S2, ..., S8, S1, S2, which erroneously indicates that the design transitions from state S2 back to state S1 to constitute a valid behavioral loop.

According to one or more aspects of the present disclosure, to address the above issues, a retiming engine (which computes lags for each gate to facilitate an optimal reduction in latches) is forced to retime all liveness and fairness gates in a netlist by the same value. As the lags of all other gates is arbitrary, a retiming engine is still provided enough flexibility to enable an optimal reduction in latches. In order to retime all liveness and fairness gates in a netlist by the same value (which allows an arbitrary retiming engine without customization to be employed), a netlist graph viewed by a retiming engine (more particularly, a retiming solver of the retiming engine) is manipulated to cause all liveness gates and fairness gates to be the same gate. In this case, instead of passing the liveness and fairness gates as distinct gates to the retiming engine, the liveness and fairness gates are relabeled as a single 'super' gate.

For example, assuming a liveness gate is implemented by an AND gate having two inputs and one output and a fairness gate is implemented by an OR gate having three inputs and two outputs, a super gate would be represented as having five inputs and three outputs. In this manner, from the viewpoint of the retiming engine, every liveness and fairness gate of the original netlist is a single node in the graph. In this case, every incoming edge to every target gate and constraint gate of the original netlist is an incoming edge to the new super gate and every outgoing edge from every target gate and constraint gate of the original netlist is an outgoing edge from the super gate.

Given an optimal retiming solution which adheres to the above criterion, counter-example traces may be determined by extracting values using known techniques and mapping the LOOP signal of the counter-example trace by delaying the LOOP signal by an amount equal to the lag of the liveness and fairness gates and truncating a length of the mapped counter-example trace to a length of the trace received upon the retimed design (plus the lag of the liveness and fairness gates). In general, this ensures that the LOOP signal assertion reflects a repeatable state pattern consistent with the original design.

In an alternate embodiment, the restriction that all liveness and fairness gates be retimed by the same amount may be relaxed to allow different lags as long as each fairness gate is lagged no greater amount than any liveness gate. Retiming under this relaxed restriction still preserves liveness checking, given the key observation that such a retiming solution cannot cause the illusion that a fairness gate is asserted during a liveness-asserting behavioral loop. In particular, the liveness-asserting behavioral loop may only "begin earlier" in the retimed design than assertion of the fairness gate. In this case, the fairness gate is guaranteed to assert during the behavior loop. Whereas the equivalent-lag restriction described above has an elegant graph-based retiming formulation, the alternate restriction is more difficult to enforce through graph manipulation. Restrictions associated with the alternate embodiment may be enforced on the retiming solution through post-processing of the retimed solution to alter possible violating lags. For example, retiming solvers that directly operate on a series of equations that reflect a graph to be optimized (e.g., integer linear programming solvers as mentioned in "Retiming Synchronous Circuitry", Lieserson and Saxe, Algorithmica (1991) 6) may directly impose the restriction by adding a set of appropriate constraints (e.g., "fairness gate f_i has lag less-than-or-equal-to liveness gate l_j") to be solved. The LOOP signal manipulation during counter-example trace manipulation discussed above can be taken to be the lag of the liveness gate associated with the counter-example trace.

Traditionally, when checking normal safety properties such as 'can this gate ever evaluate to a logical one?', it is important to verify time-steps that are effectively discarded from a retiming formulation due to forward retiming. For example, an assertion may only occur due to the propagation of initial values of latches. In this case, when latches are forward-retimed beyond a safety property gate, the retiming process may erroneously report the property as unassertable even though it truly is assertable under the initial values. This problem is addressed in traditional retiming flows by checking the initial forward-retimed time-steps independent of the verification on the resulting retimed design.

However, when performing liveness checking, there is no need to analyze the early retimed-away time-steps as any infinitely repeatable sequence of behavior may be decomposed into a behavioral loop (which begins arbitrarily late within a counter-example trace) by unrolling valuations within the behavioral loop and delaying the behavioral loop as late as desired. For example, assuming that a behavioral loop repeats from times t2 to t7, a corresponding liveness gate may be retimed by four time-steps. Instead of incurring the overhead of trying to find a counter-example trace including prefix time-steps (which have been forward-retimed off of the netlist), a counter-example trace only on the retimed netlist effectively starting at time t4 may be sought.

The fact that there is a counter-example behavioral loop from times t2 to t7 on the original netlist implies that there is a counter-example behavioral loop from times t2+i to t7+i for any positive T. In this case, a valid counter-example behavioral loop may be found from times t0 to t5 on the retimed design, which correlates to times t4 to time t9 on the original design. Once such a counter-example trace has been obtained, the retiming engine may attempt to map the counter-example trace to a minimal-length counter-example by post-processing the trace (as the trace is mapped) while determining if a valid behavioral loop is encountered earlier in the trace. In this case, from the retimed trace it is known that the behavioral loop has length of five and from the retiming result it is known that the liveness gates were retimed by four time-steps.

As such, a check determines if the liveness signal is asserted in time-frame T of the mapped trace (for T less than the lag of the liveness gates (which in this case is four)) and then if state 'i' in the mapped trace matches state 'N−i' of the counter-example trace (where N is the length of the mapped trace). In this case, the LOOP signal may be asserted starting at time 'i' and 'k−i' time-steps may be pruned from the trace, where 'k' is the amount by which the liveness gates were retimed (which in this example is four).

Figure 4:
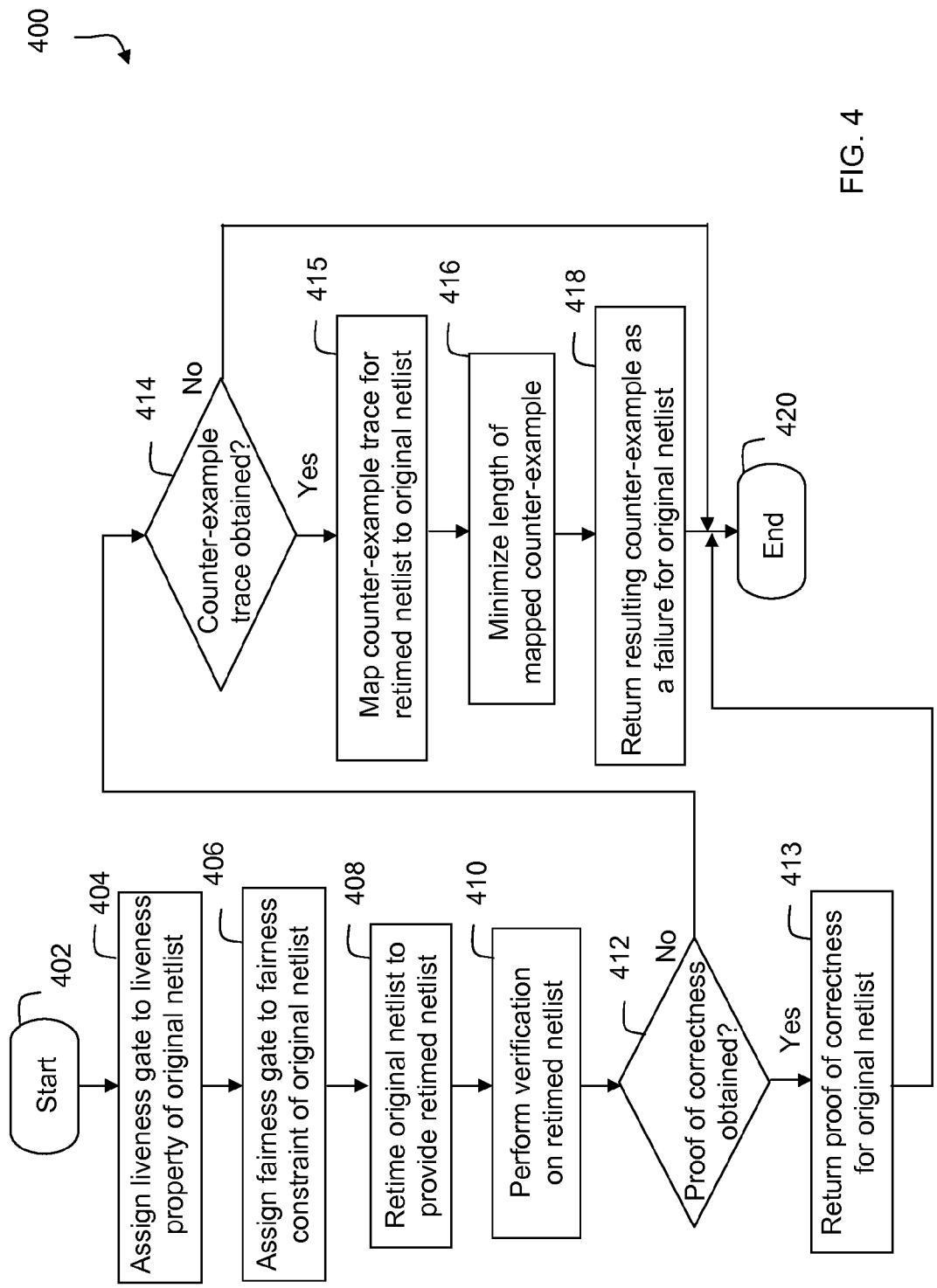
FIG. 4 is a flowchart of an example process for verification of a design, according to yet another embodiment of the present disclosure.

With reference to FIG. 4, a process 400 for verification of a retimed logic design using liveness checking is depicted. The process 400 is initiated in block 402, at which point control transfers to block 404. In block 404, a liveness gate is assigned to a liveness property for an original netlist. Next, in block 406, a fairness gate is assigned to a fairness constraint for the original netlist. In this case, the fairness gate is associated with the liveness gate and is asserted for at least one time-step during any valid behavioral loop associated with the liveness gate. Then, in block 408, the original netlist is retimed, using a retiming engine, to provide a retimed netlist. In this case, all of the liveness and fairness gates of the retimed netlist are retimed by a same value or different lags are allowed as long as the fairness gate is not lagged by a greater amount than the liveness gate. In the case of multiple fairness gates and multiple associated liveness gates, each of the fairness gates is constrained to not be lagged by a greater amount than any of the liveness gates.

Next, in block 410, verification is performed on the retimed netlist using a selected technique. Then, in decision block 412, the process 400 determines if a proof of correctness is obtained on the retimed netlist. If a proof of correctness is obtained on the retimed netlist, control transfers from block 412 to block 413 where the proof of correctness is returned for the original netlist. Following block 413, control transfers to block 420 where the process 400 terminates and control returns to a calling routine. If a proof of correctness is not obtained on the retimed netlist, control transfers from block 412 to decision block 414. In block 414, the process 400 determines if a counter-example trace is obtained on the retimed netlist. If a counter-example trace is not obtained on the retimed netlist in block 414, control transfers to block 420. If a counter-example trace is obtained on the retimed netlist in block 414, control transfers to block 415 where the counter-example trace for the retimed netlist is mapped to the original netlist. Then, in block 416, a length of the mapped counter-example is minimized. Next, in block 418, a liveness violation for the original netlist is returned in the form of the minimized length mapped counter-example. Following block 418, control transfers to block 420.

Accordingly, a number of techniques have been disclosed herein that generally reduce liveness checking verification time for integrated circuit logic designs.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to preferred embodiments thereof, it will be apparent that modifications and variations are possible without departing from the scope of the invention defined in the appended claims.

What is claimed is:

1. A method of verification of an integrated circuit logic design embodied in a netlist using a liveness-to-safety conversion as set forth by instructions executed by a computer system, comprising:

assigning, by one or more instructions executed in the computer system, liveness gates for liveness properties of the netlist;

assigning, by one or more instructions executed in the computer system, a single loop gate to provide a loop signal for the liveness gates;

preventing, by one or more instructions executed in the computer system, assertion of the single loop gate when none of the liveness gates are asserted;

sampling, by one or more instructions executed in the computer system, a first state of the netlist, the sampled first state providing an initial state for a first behavioral loop for at least one of the liveness gates following the assertion of the single loop gate;

comparing, by one or more instructions executed in the computer system, the sampled first state of the first behavioral loop with a later state of the first behavioral loop to determine if the sampled first state is repeated; and returning a liveness violation as an output of the computer system when the sampled first state is repeated and an associated one of the liveness gates remains asserted for a duration of the first behavioral loop.

2. The method of claim 1, further comprising:

sampling by one or more instructions executed in the computer system, responsive to a trigger, a second state of the netlist when the sampled first state has not been repeated, the sampled second state corresponding to an initial state for a second behavioral loop;

comparing, by one or more instructions executed in the computer system, the sampled second state of the second behavioral loop with a later state of the second behavioral loop to determine if the sampled second state is repeated; and returning a liveness violation when the sampled second state is repeated and an associated one of the liveness gates remains asserted for a duration of the second behavioral loop.

3. The method of claim 2, wherein the trigger for the sampling of the second state is based on a configurable bias to a random signal of a random gate of the netlist.

4. The method of claim 2, wherein the trigger for the sampling of the second state is based on a time-step relative to the initial state for first behavioral loop.

5. The method of claim 2, wherein the sampling of the second state is triggered based on a scenario encountered in the logic design.

6. The method of claim 1, further comprising:

checking, by one or more instructions executed in the computer system, for repetition of the first state within a specific time-range after sampling of the first state based upon a user generated coverage event or an automatically generated coverage event.

7. The method of claim 1, wherein the comparing, by one or more instructions executed in the computer system, the sampled first state of the first behavioral loop with a later state of the netlist to determine if the sampled first state is repeated occurs within a specific time range after the sampling of the sampled first state, or a specified coverage event.

8. The method of claim 1, further comprising:

detecting, by one or more instructions executed in the computer system, that a first liveness gate, included in the liveness gates, deasserted after the initial state is sampled and before the initial state is repeated; and discontinuing, by one or more instructions executed in the computer system, the comparing along the first behavioral loop when the first liveness gate deasserted after the initial state is sampled and before the initial state is repeated.

9. The method of claim 1, further comprising:

assigning, by one or more instructions executed in the computer system, a constraint gate to accumulators of the netlist that track deassertion of respective ones of the liveness gates, wherein a constraint associated with the constraint gate specifies that all of the accumulators cannot flag a deassertion; and discontinuing, by one or more instructions executed in the computer system, the comparing along the first behavioral loop when the constraint is violated.

10. A method of verification of an integrated circuit logic design embodied in a netlist using a liveness-to-safety conversion as set forth by instructions executed by a computer system, comprising:

assigning, by one or more instructions executed in the computer system, liveness gates for liveness properties of the netlist;

assigning, by one or more instructions executed in the computer system, a single loop gate to provide a loop signal for the liveness gates;

preventing, by one or more instructions executed in the computer system, assertion of the single loop gate when none of the liveness gates are asserted;

sampling, by one or more instructions executed in the computer system, a first state of the netlist, the sampled first state providing an initial state for a first behavioral loop for at least one of the liveness gates following the assertion of the single loop gate;

comparing, by one or more instructions executed in the computer system, the sampled first state of the first behavioral loop with a later state of the first behavioral loop to determine if the sampled first state is repeated;

checking, by one or more instructions executed in the computer system, for repetition of the first state within a specific time-range after sampling of the first state; and returning a liveness violation as an output of the computer system when the sampled first state is repeated and an associated one of the liveness gates remains asserted for a duration of the first behavioral loop.

11. The method of claim 10, further comprising:

sampling by one or more instructions executed in the computer system, responsive to a trigger, a second state of the netlist when the sampled first state has not been repeated, the sampled second state corresponding to an initial state for a second behavioral loop;

comparing, by one or more instructions executed in the computer system, the sampled second state of the second behavioral loop with a later state of the second behavioral loop to determine if the sampled second state is repeated; and returning a liveness violation when the sampled second state is repeated and an associated one of the liveness gates remains asserted for a duration of the second behavioral loop.

12. The method of claim 11, wherein the trigger for the sampling of the second state is based on a configurable bias to a random signal of a random gate of the netlist.

13. The method of claim 11, wherein the trigger for the sampling of the second state is based on a time-step relative to the initial state for first behavioral loop.

14. The method of claim 11, wherein the sampling of the second state is triggered based on a scenario encountered in the logic design.

15. The method of claim 10, wherein the checking, by one or more instructions executed in the computer system, for repetition of the first state within a specific time-range after sampling of the first state is based upon a user generated coverage event or an automatically generated coverage event.

16. The method of claim 10, wherein the comparing, by one or more instructions executed in the computer system, the sampled first state of the first behavioral loop with a later state of the netlist to determine if the sampled first state is repeated occurs within a specific time range after the sampling of the sampled first state, or a specified coverage event.

17. The method of claim 10, further comprising:
detecting, by one or more instructions executed in the computer system, that a first liveness gate, included in the liveness gates, deasserted after the initial state is sampled and before the initial state is repeated; and
discontinuing, by one or more instructions executed in the computer system, the comparing along the first behavioral loop when the first liveness gate deasserted after the initial state is sampled and before the initial state is repeated.

18. The method of claim 10, further comprising:
assigning, by one or more instructions executed in the computer system, a constraint gate to accumulators of the netlist that track deassertion of respective ones of the liveness gates, wherein a constraint associated with the constraint gate specifies that all of the accumulators cannot flag a deassertion; and
discontinuing, by one or more instructions executed in the computer system, the comparing along the first behavioral loop when the constraint is violated.

19. A computer system configured to verify a logic design embodied in a netlist using a liveness-to-safety conversion, comprising:
a memory subsystem configured to store code; and
a processor coupled to the memory subsystem, wherein the processor is configured to execute code to:
assign liveness gates for liveness properties of the netlist;
assign a single loop gate to provide a loop signal for the liveness gates;
prevent assertion of the single loop gate when none of the liveness gates are asserted;
sample a first state of the netlist, the sampled first state providing an initial state for a first behavioral loop for at least one of the liveness gates following the assertion of the single loop gate;
compare the sampled first state of the first behavioral loop with a later state of the behavioral loop to determine if the sampled first state is repeated; and
return a liveness violation when the sampled first state is repeated and an associated one of the liveness gates remains asserted for a duration of the first behavioral loop.

20. The system of claim 19, wherein the processor is further configured to execute code to:
sample, responsive to a trigger, a second state of the netlist when the sampled first state has not been repeated, the sampled second state corresponding to an initial state for a second behavioral loop;
compare the sampled second state of the second behavioral loop with a later state of the second behavioral loop to determine if the sampled second state is repeated; and
return a liveness violation when the sampled second state is repeated and an associated one of the liveness gates remains asserted for a duration of the second behavioral loop.

* * * * *